United States Patent [19]
Hoshizaki et al.

[11] Patent Number: 5,922,651
[45] Date of Patent: Jul. 13, 1999

[54] METHOD FOR FORMING HIGH TC SUPERCONDUCTIVE THIN FILMS

[75] Inventors: Hiroki Hoshizaki; Masahiro Kawamura, both of Nisshin, Japan

[73] Assignee: Advanced Mobile Telecommunication Technology Inc., Aichi, Japan

[21] Appl. No.: 08/978,008

[22] Filed: Nov. 25, 1997

[30] Foreign Application Priority Data

Feb. 6, 1997 [JP] Japan ................................. 9-023573

[51] Int. Cl.⁶ .................................................. H01L 39/24
[52] U.S. Cl. ........................ 505/473; 505/475; 505/731; 427/62
[58] Field of Search ..................... 505/473, 475, 505/731; 204/192.24; 427/62

[56] References Cited

PUBLICATIONS

Harshavardhan et al, Appl. Phys. Lett. 64(12), Mar. 1994, pp. 1570–1572.

*Primary Examiner*—Roy V. King
*Attorney, Agent, or Firm*—Lane, Aitken & McCann

[57] ABSTRACT

Herein disclosed is a superconductive thin film formation method of forming a superconductive thin film having a high critical temperature and a low surface resistance. The method comprises a first step of depositing a superconductive thin film layer on a substrate under a first condition. The superconductive thin film layer has a thickness smaller than that of the superconductive thin film. The method further comprises a second step of introducing oxygen under a second condition. The method further comprises a third step of depositing a superconductive thin film layer on the previously deposited superconductive thin film layer under the first condition and fourth step of introducing oxygen under the second condition. The method further comprises a fifth step of repeating the third and fourth steps until the sum of the thicknesses of the superconductive thin film layers is substantially equal to the predetermined thickness of the superconductive thin film.

3 Claims, 8 Drawing Sheets

METHOD FOR FORMING HIGH TC SUPERCONDUCTIVE THIN FILMS

BACKGROUND OF THE INVENTION

1. Field of the Invention

The present invention relates to a method of forming a superconductive thin film by using a physical vapor deposition method, and more particularly, to a method of forming a superconductive thin film having a high critical temperature of 87K or higher and having a thickness of 500 nm or larger.

2. Description of the Related Art

There has so far been provided with a high temperature superconductor which is called as an yttrium, barium, and copper oxide system (hereinlater referred to simply as a "YBCO system"). The YBCO system superconductor has a composition represented by "$Y_1Ba_2Cu_3O_y$,". The subscript character "y" attached to the chemical symbol "O" represents the oxygen content of the YBCO system superconductor. The oxygen content of the YBCO system superconductor is varied between 6 and 7. In the YBCO system superconductor thus composed, there is caused, at a critical temperature, superconductive phenomena in which the superconductor has an extremely low electric resistance. The critical temperature of the YBCO system superconductor is much higher than the boiling point of liquid nitrogen.

As is well known, the YBCO system superconductor forms crystals in either tetragonal system or orthorhombic system. There is caused a phase transition between the tetragonal system and the orthorhombic system in the crystals in accordance with the oxygen content of the composition. When the superconductor contains insufficient oxygen in the composition, i.e. when the oxygen content $y \leq 6.5$, the superconductor forms the tetragonal system crystal and has a critical temperature of lower than or equal to 50K. When the superconductor contains sufficient oxygen in the composition, i.e. when the oxygen content $y \leq 6.5$, the superconductor forms the orthorhombic system crystal and has a critical temperature between 80K and 87K. That is to say that the superconductor in the orthorhombic system crystal has an extremely high critical temperature in comparison with that of the superconductor in the tetragonal system crystal.

The above YBCO system superconductor is preferably utilized for an integrated circuit, because of the fact that the superconductor has an advantage over a normal metal conductor in reducing transmission loss of signals and in enhancing the frequency response characteristics of the integrated circuit. In this instance, the YBCO system superconductor is generally formed into a thin film having a thickness of several hundred nanometers.

In general, the superconductive thin film which is utilized for fabricating the integrated circuit is deposited on the substrate through a physical vapor deposition method (hereinlater referred to as "PVD method" for brevity), e.g., a sputtering method or a reactive vapor deposition method.

Figure 8:
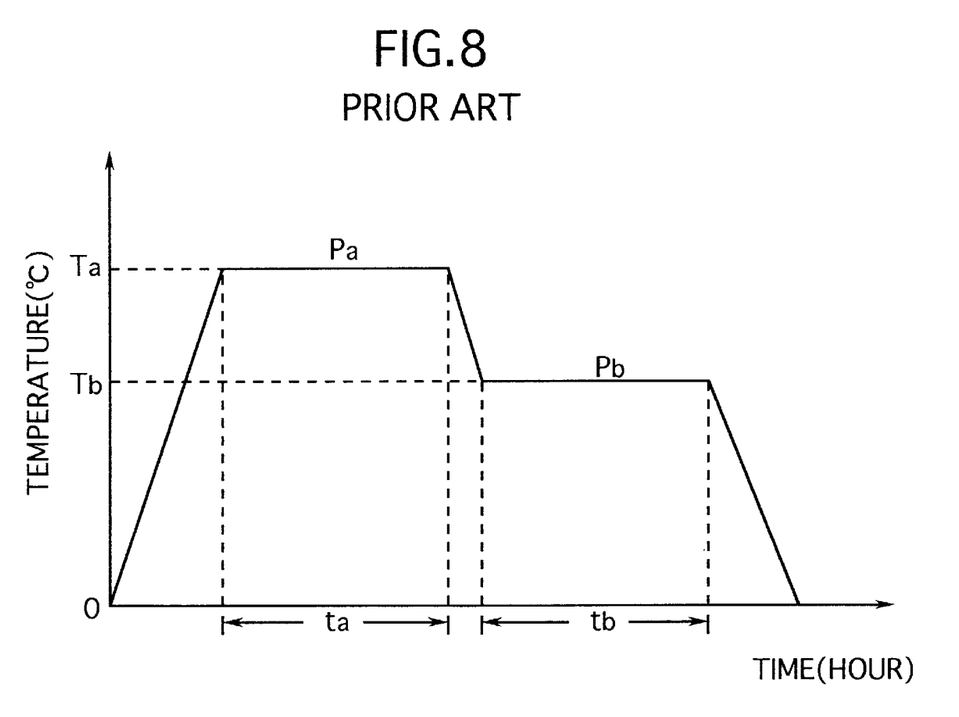
FIG. 8 is a graph showing variation in temperature in each of processes in prior art.

The conventional superconductive thin film formation method will be explained hereinlater with referring to FIG. 8 of the drawings. The superconductive thin film formation method comprises processes of depositing the superconductive thin film and of introducing oxygen. As shown in FIG. 8, the temperature of the substrate is varied as time lapses in the formation of the superconductive thin film. The above processes are denoted by the symbols "Pa" and "Pb", respectively, in FIG. 8.

The deposition process Pa comprises the steps of: heating the substrate at a first substrate temperature Ta of 650° C. or higher; and depositing the superconductor on the substrate under a first oxygen partial pressure of 1 Torr or lower. As shown in FIG. 8, the deposition process Pa is carried out and continues for a deposition process time ta. Thus formed superconductive thin film has a thickness of 500 nm or smaller and a critical temperature of 50K or lower. The reason why the superconductive thin film has the low critical temperature is considered that the superconductive thin film dose not contain sufficient oxygen in the composition and forms tetragonal system crystal.

In order to change the superconductive thin film in phase from the tetragonal system crystal to the orthorhombic system crystal, the oxygen introduction process Pb is carried out. The oxygen introduction process Pb is carried out through an annealing treatment under the condition of a second oxygen partial pressure of 10 Torr or higher and a second substrate temperature Tb of 500° C. or lower. The second oxygen partial pressure is higher than the first oxygen partial pressure. The second substrate temperature Tb is lower than the first substrate temperature Ta.

The oxygen introduction process Pb follows the deposition process Pa and is carried out and continues for an oxygen introduction process time tb. After the oxygen introduction process Pb, the superconductive thin film has a critical temperature of 80–87K. As described above, before the oxygen introduction process Pb, the superconducting thin film has the critical temperature of 50K or lower. It is understood from this result that the critical temperature after the process Pb is higher than the critical temperature before the process Pb.

In the above conventional method, the superconductive thin film attains the various thicknesses in accordance with the process times. For instance, each of the processes Pa and Pb is carried out and continues for about 6 hours to attain the thickness of 450 nm. Furthermore, each of the processes Pa and Pb is carried out and continues for about 12 hours to attain the thickness of 900 nm.

The superconductive thin films having the thicknesses of 450, 600 and 900 nm formed through the conventional method have the critical temperatures of 87, 84 and 80K, respectively. This means that as the thickness of the superconductive thin film becomes larger, the critical temperature of the superconductive thin film becomes lower.

A drawback is, however, encountered in a prior-art superconductive thin film formation method of the above described nature in that it is impossible to form the superconductive thin film having a thickness of 500 nm or larger and a critical temperature of 87K or higher.

SUMMARY OF THE INVENTION

It is an object of the present invention to provide a superconductive thin film formation method of forming a superconductive thin film having a high critical temperature of 87K or higher and having a thickness of 500 nm or larger.

It is another object of the present invention to provide a program storage device storing therein a program executed by a microprocessor to perform a method of forming a superconductive thin film having a high critical temperature of 87K or higher and having a thickness of 500 nm or larger.

In accordance with a first aspect of the present invention, there is provided a superconductive thin film formation method of forming a superconductive thin film. The superconductive thin film has a predetermined thickness. The method comprises the steps of:

(a) depositing a superconductive thin film layer on a substrate under a first oxygen partial pressure in a chamber, the superconductive thin film layer having a thickness smaller than that of the superconductive thin film;

(b) introducing oxygen under a second oxygen partial pressure in the chamber, the second oxygen partial pressure being higher than the first oxygen partial pressure;

(c) depositing a superconductive thin film layer on the previously deposited superconductive thin film layer under the first oxygen partial pressure;

(d) introducing oxygen under the second oxygen partial pressure; and (e) repeating the steps (c) and (d) until the sum of the thicknesses of the superconductive thin film layers is substantially equal to the predetermined thickness of the superconductive thin film.

Each of the superconductive thin film layers may have a thickness smaller than 500 nm. The superconductive thin film may attain a thickness of 450 nm to 2700 nm. The superconductive thin film may have a critical temperature equal to or higher than 87K Furthermore, the superconductive thin film may have a surface resistance smaller than 0.4 m$\Omega$ at 70K.

In accordance with a second aspect of the present invention, there is provided a program storage device storing therein a program executed by a microprocessor to perform a method of forming a superconductive thin film, the method comprising the steps of:

(a) depositing a superconductive thin film layer on a substrate under a first oxygen partial pressure in a chamber, the superconductive thin film layer having a thickness smaller than that of the superconductive thin film;

(b) introducing oxygen under a second oxygen partial pressure in the chamber, the second oxygen partial pressure being higher than the first oxygen partial pressure;

(c) depositing a superconductive thin film layer on the previously deposited superconductive thin film layer under the first oxygen partial pressure;

(d) introducing oxygen under the second oxygen partial pressure; and (e) repeating the steps (c) and (d) until the sum of the thicknesses of the superconductive thin film layers is substantially equal to the predetermined thickness of the superconductive thin film.

Each of the superconductive thin film layers may have a thickness smaller than 500 nm. The superconductive thin film may attain a thickness of 450 nm to 2700 nm. The superconductive thin film may have a critical temperature equal to or higher than 87K. Furthermore, the superconductive thin film may have a surface resistance smaller than 0.4 m$\Omega$ at 70K.

BRIEF DESCRIPTION OF THE DRAWINGS

The present invention and many of the attendant advantages thereof will be better understood from the following detailed description when considered in connection with the accompanying drawings, wherein.

DESCRIPTION OF THE PREFERRED EMBODIMENTS

FIGS. 1 to 7 of the drawings collaboratively show a preferred embodiment of a superconductive thin film formation method according to the present invention and adopting the PVD method, which will be described hereinlater.

Figure 1:
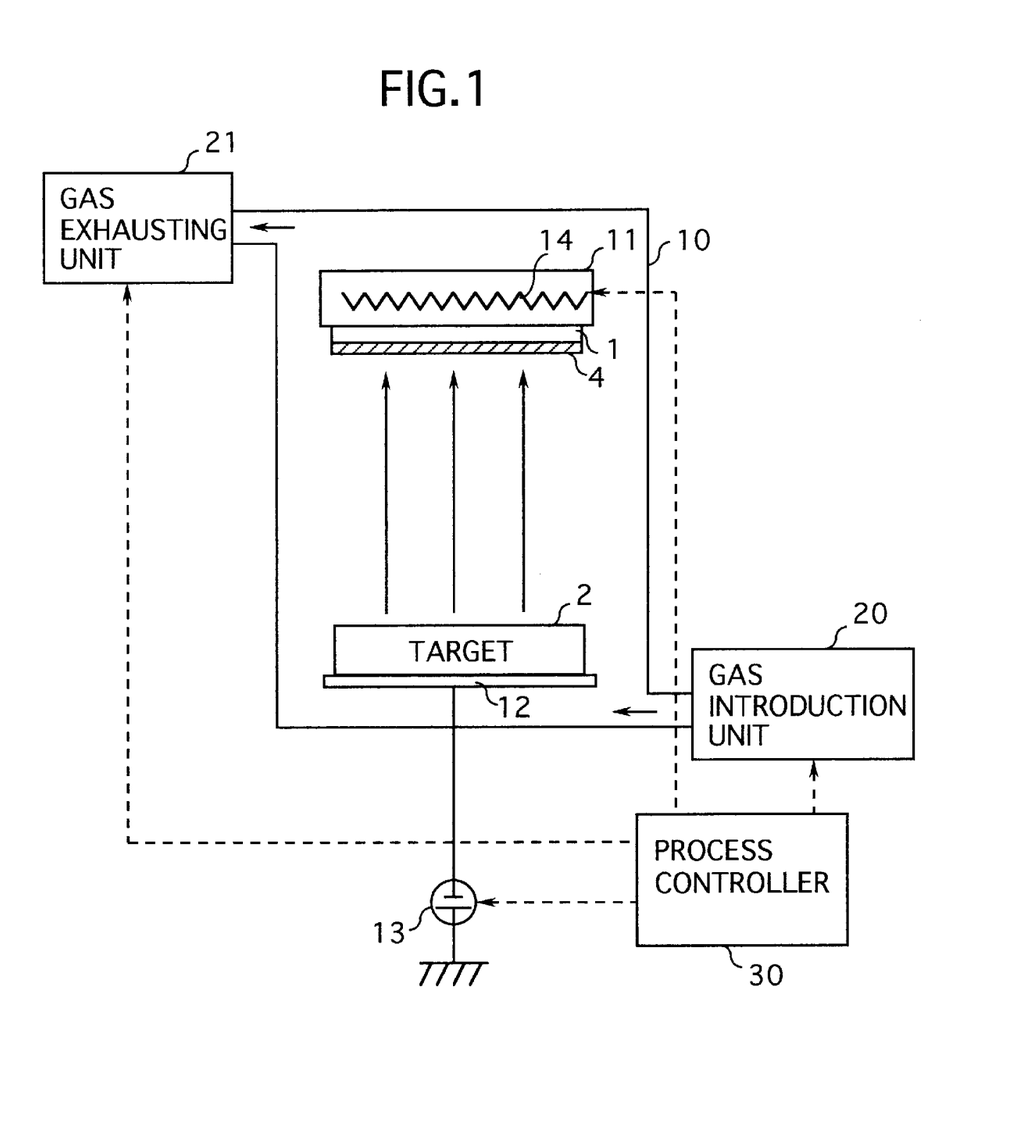
FIG. 1 is a block diagram showing a preferred embodiment of a superconductive thin film formation apparatus for performing a method of forming a superconductive thin film according to the present invention.

There is best shown in FIG. 1 a superconductive thin film formation apparatus adopting a sputtering deposition method as the PVD method. The superconductive thin film formation apparatus comprises a vacuum chamber 10, a substrate holder 11 and a support plate 12.

The substrate holder 11 is housed face to face with the support plate 12 in the vacuum chamber 10 and holds a substrate 1. The substrate 1 is made out of MgO having a <100> crystal orientation and is 4 cm square. The support plate 12 holds thereon a sputtering target 2. The sputtering target 2 is, for example, a YBCO bulk and placed on the support plate 12 serving as a cathode electrically connected to a direct current (hereinlater for brevity referred to as "DC") power source 13. The YBCO bulk is represented by a $Y_1Ba_2Cu_3O_y$ in composition and having a disk shape defined by a diameter of 4 inches and a thickness of 2 mm. The substrate holder 11 includes a radiant heat source 14. The radiant heat source 14 is operated to heat the substrate 1. The substrate 1 and the sputtering target 2 are placed 50 mm away from each other.

The superconductive thin film formation apparatus further comprises a gas introduction unit 20, a gas exhausting unit 21 and a process controller 30. The gas introduction unit 20 is connected to a gas supply source (not shown) to introduce a gas, e.g., $O_2$+Ar or $O_2$ gas, into the vacuum chamber 10. The gas exhausting unit 21 exhausts the gas from the vacuum chamber 10.

The process controller 30 comprises a microprocessor (not shown) including a storage unit, a control unit, an arithmetic logic unit and an input/output unit. The process controller 30 executes a predetermined program to perform the method according to the present invention. It will be explained later in detail how the process controller 30 executes the program to perform the method according to the present invention. The process controller 30 is designed to control the gas introduction unit 20 and the gas exhausting unit 21 to regulate respective gas partial pressure in the vacuum chamber 10. The process controller 30 is further designed to control the DC power source 13 and the radiant heat source 14.

When the gas is introduced from the gas introduction unit 20 into the vacuum chamber 10 and the DC power source 13 is operated to apply a DC power to the sputtering target 2, there is produced a plasma between the sputtering target 2 and the substrate 1. The positive ions bombard the sputtering target 2 to dislodge atoms from the sputtering target 2. The dislodged atoms of the sputtering target 2 are transferred to and deposited on the surface of the substrate 1. The atoms deposited through the sputtering method form a thin film denoted by reference numeral "4" in FIG. 1.

Figure 2:
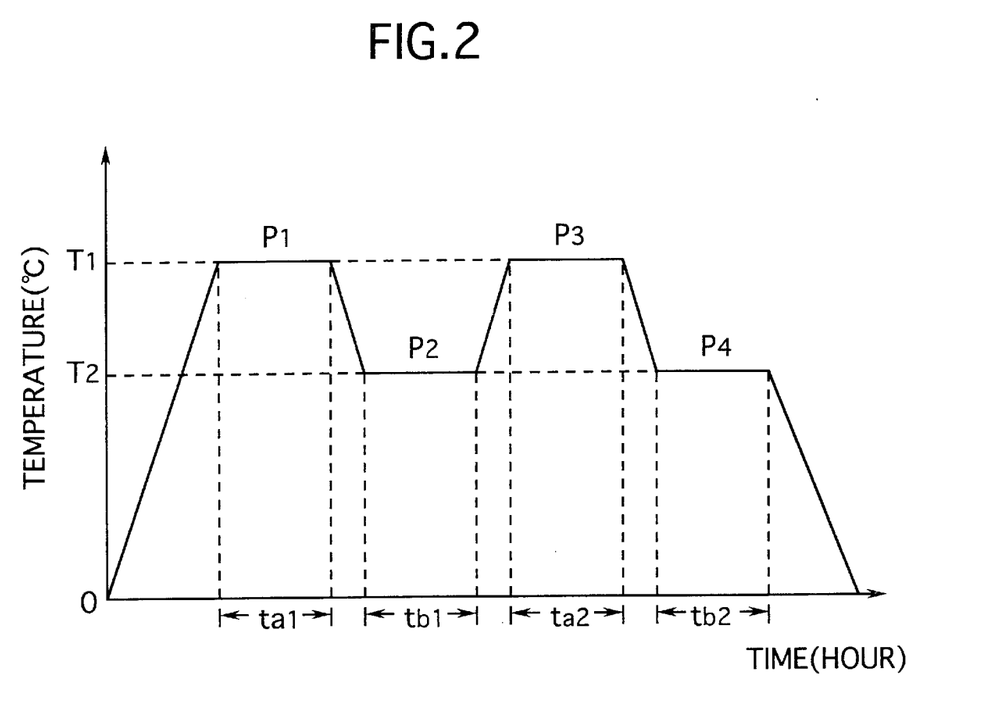
FIG. 2 is a graph showing variation in temperature in each of processes according to the present invention.

Using the thus constructed superconductive thin film formation apparatus, the superconductive thin film having a predetermined thickness can be formed through the following method according to the present invention. The method will be explained hereinlater with referring to FIG. 2. FIG. 2 is a graph showing variation in temperature during the formation of the superconductive thin film.

As described above in the prior-art method shown in FIG. 8, the deposition process Pa is carried out and continues for the deposition process time ta, while the oxygen introduction process Pb is carried out and continues for the oxygen introduction process time tb. In the present invention, each of the process times ta and tb is divided into "n" pieces of time to obtain n time spans, for example, ta1, ta2, tb1 and tb2. Here, n is a positive integer "1, 2, 3, . . ." and represents the number of repetition of a pair of the deposition process and the oxygen introduction process. In this embodiment, n is assumed to be 2.

As shown in FIG. 2, the superconductive thin film formation method of the present invention comprises a first process P1 of depositing a superconductive thin film layer on the substrate 1 under a first oxygen partial pressure in the vacuum chamber 10. The superconducting thin film layer is represented by the reference numeral "4a" in FIG. 3 which shows a fragmental sectional view of the superconducting thin film 4. The first process P1 is carried out and continues for first time span ta1 of the process time ta. Then, the superconductive thin film layer 4a attains a thickness smaller than the total thickness of the superconductive thin film and equal to, for example, 1/n times of the total thickness of the superconducting thin film 4.

The superconductive thin film formation method further comprises a second process P2 of introducing oxygen under a second oxygen partial pressure in the vacuum chamber 10. The second oxygen partial pressure is higher than the first oxygen partial pressure. The second process P2 is carried out and continues for a first time span tb1 of the process time tb.

Figure 3:
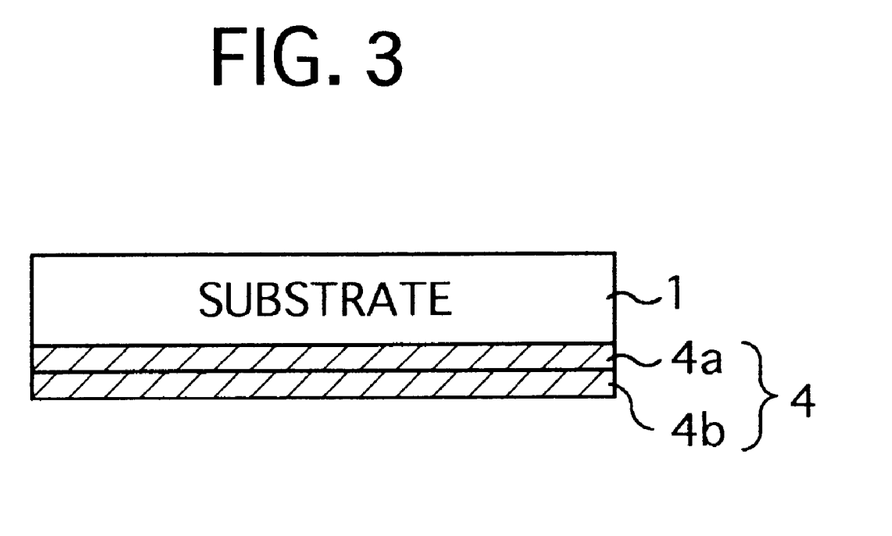
FIG. 3 is a fragmental sectional view showing the superconducting thin film shown in FIG. 1.

The method further comprises a third process P3 of depositing a superconductive thin film layer 4b on the superconductive thin film layer 4a shown in FIG. 3 under the first oxygen partial pressure. As shown in FIG. 2, the third process P3 is carried out and continues for a second time span ta2 of the process time ta. The method further comprises a fourth process P4 of introducing under the second oxygen partial pressure. The fourth process P4 is carried out and continues for a second time span tb2 of the process time tb in FIG. 2.

The superconductive thin film formation method further comprises a fifth process of repeating the third and forth processes P3 and P4 until the sum of the thicknesses of the superconductive thin film layers attains the predetermined thickness of the superconductive thin film 4. In this embodiment shown in FIG. 2, when the fourth process P4 is completed, the sum of the thicknesses of the superconductive thin film layers 4a and 4b attains the predetermined thickness of the superconductive thin film 4. Therefore, the fifth process is not needed in this embodiment.

More specifically, each of the time spans ta1, tb1, ta2 and tb2 is assumed to be 3 hours. In the first process P1, the gas introduction unit 20 introduces the $O_2$+Ar gas into the vacuum chamber 10 to obtain a total gas pressure of 0.2 Torr. The total gas pressure includes an oxygen partial pressure, i.e., the first oxygen partial pressure of 0.15 Torr and an Ar partial pressure of 0.05 Torr. The process controller 30 controls the radiant heat source 14 to keep a substrate temperature at a first substrate temperature T1 of 740° C. The process controller 30 controls the DC power source 13 to apply the DC 150 W power to the sputtering target 2. The first process P1 is carried out and continues for the first time span ta1 of the process time ta under the aforementioned condition. Consequently, the atoms of the sputtering target 2 are deposited on the substrate 1 to form a first superconductive thin film layer 4a.

In the second process P2, the gas introduction unit 20 introduces the $O_2$ gas into the vacuum chamber 10 to obtain the second oxygen partial pressure of 660 Torr. The process controller 30 controls the radiant heat source 14 to keep the substrate temperature at a second substrate temperature T2 of 480° C. The process controller 30 controls the DC power source 13 to terminate the application of the DC power. After the second process P2 is carried out and continues for the first time span tb1 of the process time tb, the third process P3 follows the second process P2.

In the third process P3, the process controller 30 controls the gas introduction unit 20 and the gas exhausting unit 21 to regulate the pressure in the vacuum chamber 10 under the same conditions as those of the first process P1. The process controller 30 also controls the DC power source 13 and the radiant heat source 14 under the same conditions as those of the first process P1. After the third process P3 is carried out and continues for the second time span ta2 of the process time ta, the atoms are deposited on the first superconductive thin film layer 4a to form a second superconductive thin film layer 4b.

The fourth process P4 follows the third process P3. In the fourth process P4, the process controller 30 controls the gas introduction unit 20 and the gas exhausting unit 21 to regulate the pressure in the vacuum chamber 10 under the same conditions as those of the second process P2. The process controller 30 also controls the DC power source 13 and the radiant heat source 14 under the same conditions as those of the second process P2. The fourth process P4 is carried out and continues for the second time span tb2 of the process time tb.

In this embodiment, the sum of the thicknesses of the first and second superconductive thin film layers 4a and 4b is substantially equal to 450 nm after the fourth process P4. The formed superconductive thin film 4 having the thickness of 450 nm has a critical temperature of 90K By way of comparison, the first and second processes Pa and Pb of the prior-art superconductive thin film formation method shown in FIG. 8 are carried out and respectively continues for 6 hours to make the superconductive thin film batchwise attain a thickness of 450 nm. As described above, the superconductive thin film formed in the prior-art method has the critical temperature of 87K. This means that the method according to the present invention has an advantage over the prior-art method in making it possible to form the superconductive thin film having a high critical temperature.

When the fifth process is repeated one time and when the other processes are carried out under the same conditions as those of the above embodiment to form a third superconductive thin film layer on the second superconductive thin film layer, the superconductive thin film attains a thickness of 675 nm and has a critical temperature of 89K.

When the fifth process is further repeated one time, i.e. the fifth process is repeated two times in total to form a fourth superconductive thin film layer on the third superconductive thin film layer, the superconductive thin film attains a thickness of 900 nm and has a critical temperature of 88K. By way of comparison the processes Pa and Pb of the prior-art method shown in FIG. 8 are carried out and respectively continues for 12 hours in order to batchwise form the superconductive thin film having a thickness of 900 nm. As described above, the superconductive thin film formed in the prior art method has the critical temperature of 80K. This means that the method according to the present invention can form the superconductive thin film having the critical temperature higher than that of the prior-art. The present invention can be provided with the especially effective method of forming the superconductive thin film having a thickness equal to or larger than 500 nm.

The critical temperature of the superconductive thin film becomes closer to the critical temperature of the bulk of 93K as the repetition count n becomes larger. However, as the repetition count n becomes larger, the time taken to rise the substrate temperature also becomes larger. The repetition count n should be determined in consideration of the manufacturing time as well as the critical temperature.

In this embodiment, the formation of the superconductive thin film is performed by executing a program. The program is stored in a program storage device, i.e. a floppy disk, a hard disk, a ROM, a CD-ROM, a DVD-ROM, an EPROM or the like. The program is preinstalled into and executed by the process controller 30 shown in FIG. 1.

Figure 4:
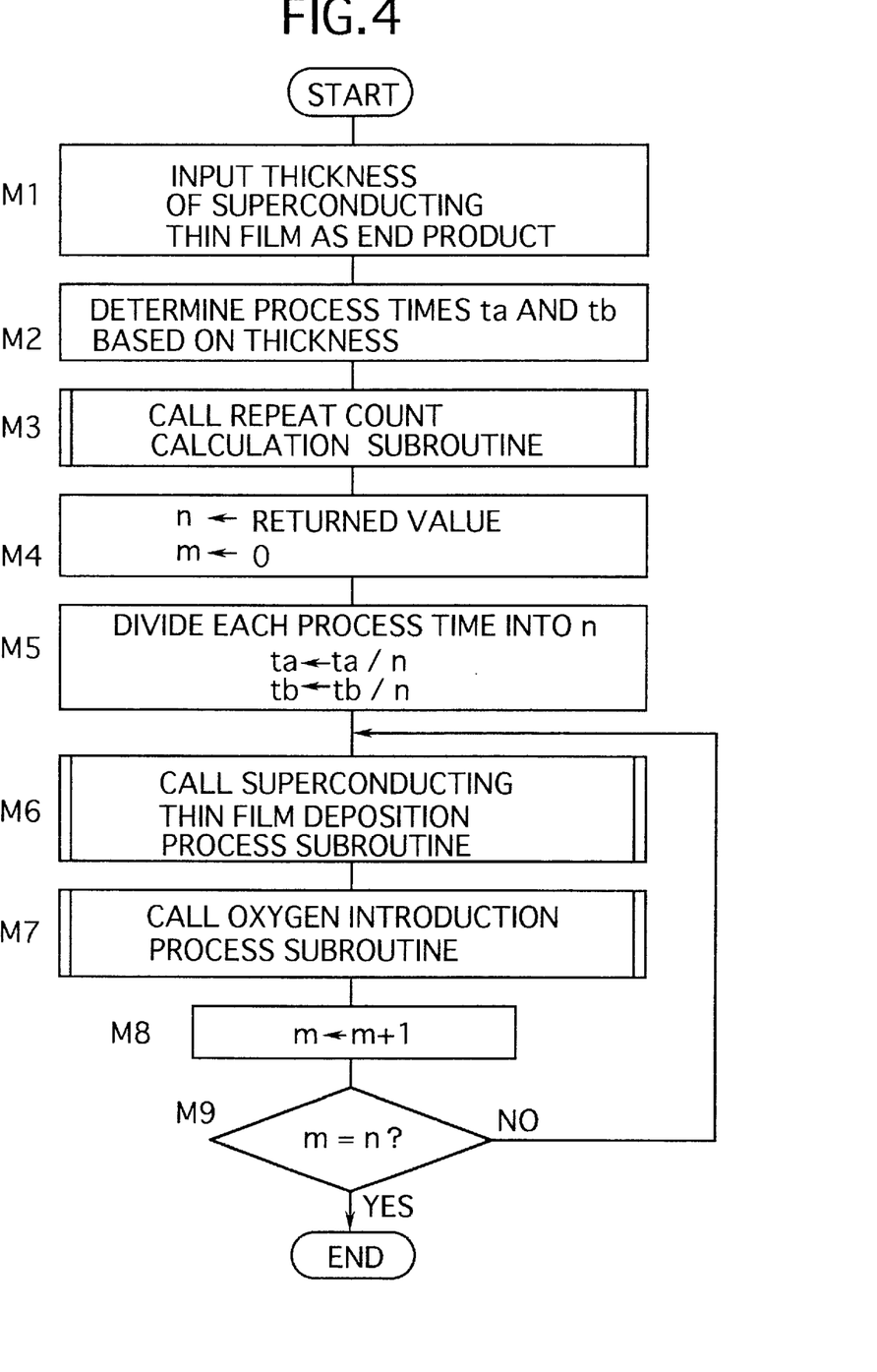
FIG. 4 is an overall outline flowchart showing the flow of a main process of forming the superconductive thin film through the method according to the present invention.

FIG. 4 is an overall outline flowchart showing the flow of main routine of forming the superconductive thin film. As shown in FIG. 4, the main routine comprises the steps M1 to M9. In the step M1, the thickness of the superconductive thin film as an end product is inputted. The predetermined thickness of the superconductive thin film may be previously set or, if desired, may be optionally inputted by an operator.

As described above, the superconductive thin film formation method comprises a deposition process of depositing the superconductive thin film by using the sputtering method and an oxygen introduction process of introducing the oxygen gas by using an annealing treatment. The deposition process is carried out under a first condition for a deposition process time ta, while the oxygen introduction process is carried out under a second condition for an oxygen introduction process time tb.

In the step M2, the process times ta and tb are determined based on the predetermined thickness. The process times ta and tb are not only automatically calculated by the process controller 30 but also manually inputted by the operator. In the step M3, the control is passed to a repetition count calculation subroutine.

Figure 5:
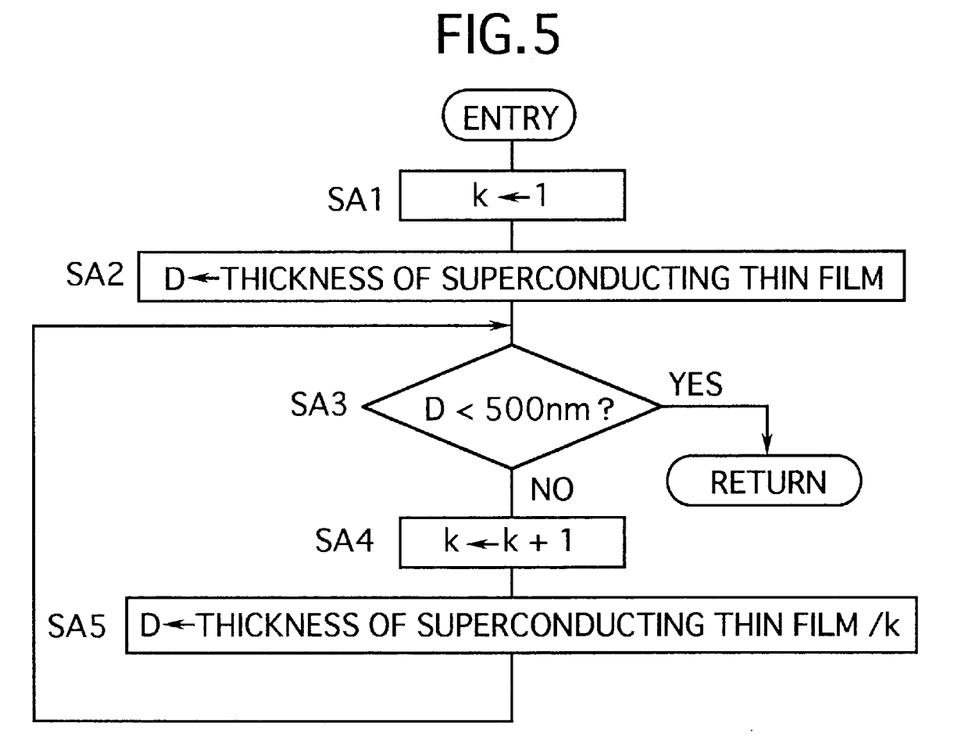
FIG. 5 is a flowchart showing the flow of a subroutine shown by the step M3 in FIG. 4.

In the superconductive thin film formation method, the deposition process and the oxygen introduction process are carried out and continue for time spans of the process times ta and tb each obtained by dividing the process times ta and tb by the repetition count n. In order to determine the repetition count n, the repetition count calculation subroutine is carried out through the steps which will be explained hereinlater with making reference to FIG. 5. FIG. 5 is a flowchart showing the flow of the repetition count calculation subroutine. When the repetition count calculation subroutine is called by the main routine in the step M3, the repetition count calculation subroutine is executed through the steps SA1 to SA5. The repetition count calculation subroutine uses first and second variables which are denoted by the letters "k" and "D", respectively.

In the step SA1, the first variable k is set to 1. In the step SA2, the second variable D is set to the thickness obtained from the main routine. In the step SA3, a judgment is made upon whether the second variable D is smaller than a thickness of 500 nm or not. If the answer in the step SA3 is in the negative "NO", the step S3 leads to the step SA4 in which the first variable k is incremented by 1. If the answer in the step SA3 is in the affirmative "YES", the control is returned to the main routine and the first variable k is passed to the main routine. In the step SA3, the criterion of the thickness of 500 nm utilized for the judgement represents the desired thickness of each superconductive thin film layer. In this embodiment, the thickness of each superconductive thin film layer is assumed to be smaller than 500 nm, but that is not limited to 500 nm and, if desired, may be changed into another thickness.

Returning back to FIG. 4, the returned value is assigned to the repetition count n and a loop counter m is set to "0" in the step M4. In the step M5, each of the process times ta and tb is divided by the repetition count n. In the step M6, the control is passed to a deposition process subroutine. The deposition process subroutine will be described in detail hereinlater with referring to FIG. 6 which shows a flowchart comprises steps SB1 to SB5.

Figure 6:
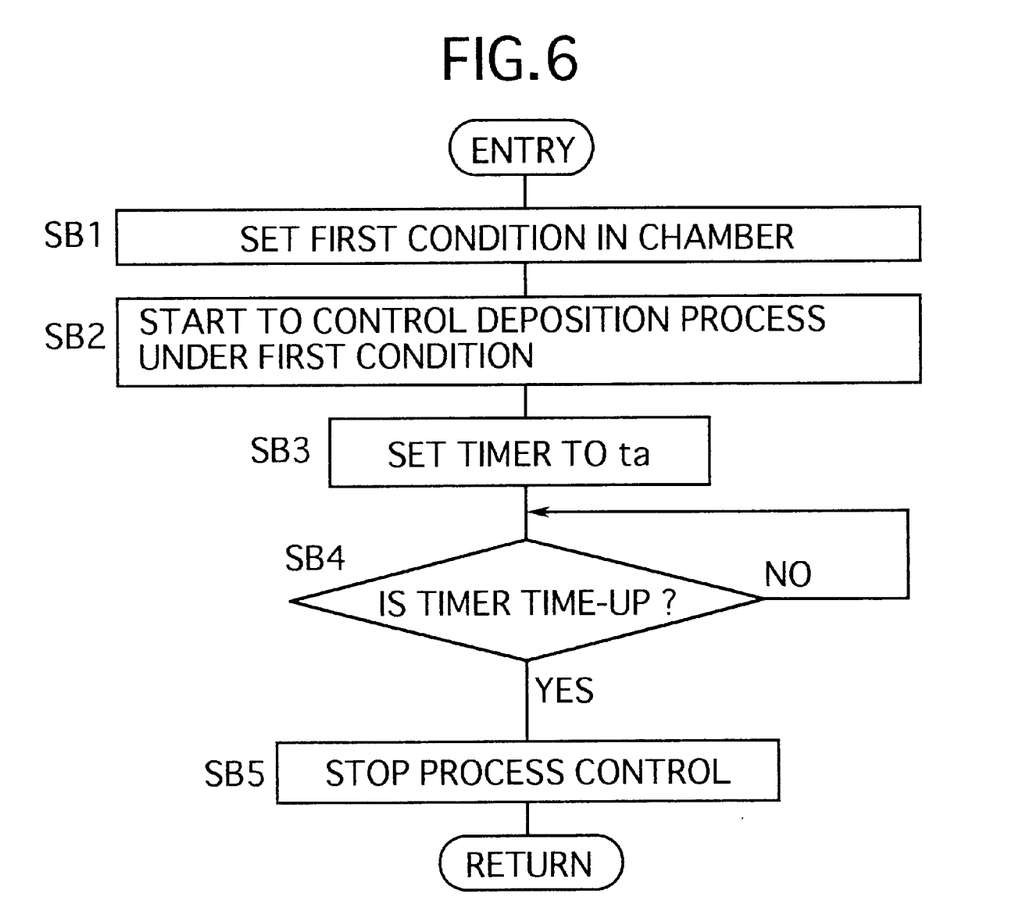
FIG. 6 is a flowchart showing the flow of a subroutine shown by the step M6 in FIG. 4.

Once the deposition process subroutine is called by the main routine, the deposition process subroutine is executed through the steps SB1 to SB5. In the step SB1, in order to carry out the deposition process under the first condition, various criteria pertinent to the substrate temperature and the oxygen partial pressure in the vacuum chamber 10 are determined. The first condition is the same as that of the first process P1 as described above. In the step SB2, the process controller 30 starts to control the deposition process under the first condition. At the same time, the process controller 30 controls the DC power source 13 to perform the sputtering. In the step SB3, there is a timer which is set to the process time ta and then starts to count up the process time ta. In the step SB4, a judgement is made upon whether the timer is time-up or not. If the answer in the step SB4 is in the negative "NO", the control is returned to itself i.e., the step SB4. If the answer in the step SB4 is in the affirmative "YES", the control is passed to the step SB5 wherein the process controller 30 stops to control the deposition process. Then, the control is returned to the main routine.

Returning back to FIG. 4, the step M6 is followed by the step M7. Then the control is passed to the oxygen introduction process subroutine. The oxygen introduction process subroutine will be described in detail hereinlater with referring to FIG. 7 which shows a flowchart comprises steps SC1 to SC5.

Figure 7:
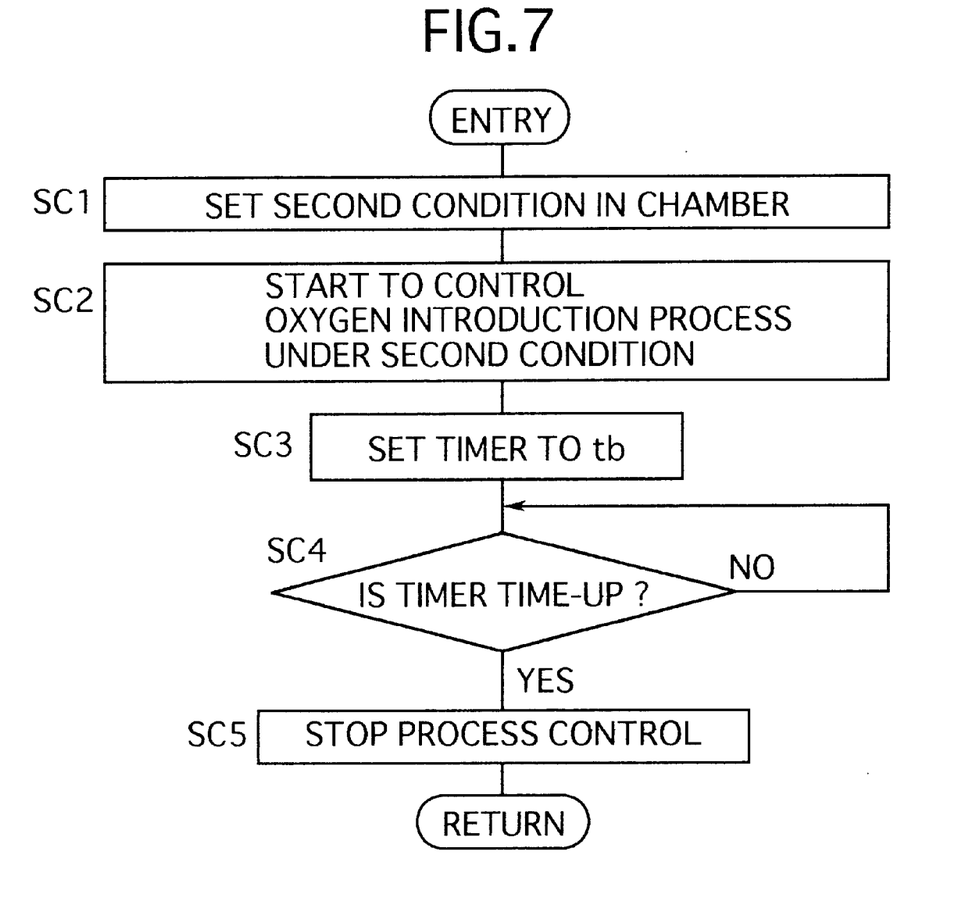
FIG. 7 is a flowchart showing the flow of a subroutine shown by the step M7 in FIG. 4.

Once the oxygen introduction process subroutine is called by the main routine, the oxygen introduction process subroutine is executed through the steps SC1 to SC5. In the step SC1, in order to control the oxygen introduction process under the second condition, various criteria pertinent to the substrate temperature and the oxygen partial pressure in the vacuum chamber 10 are determined. The second condition is the same as that of the second process P2 as described above. In the step SC2, the process controller 30 starts to control the oxygen introduction process under the second condition. As a result, the annealing treatment is carried out. In the step SC3, there is a timer which is set to the process time tb and starts to count up the process time tb. In the step SC4, a judgement is made upon whether the timer is time-up or not. If the answer in the step SC4 is in the negative "NO", the control is returned to itself, i.e. the step SC4. If the answer in the step SC4 is in the affirmative "YES", the control is passed to the step SC5 wherein the process controller 30 stops to control the oxygen introduction process. Then, the control is returned to the main routine.

Returning back to FIG. 4, the main routine receives the control from the deposition process subroutine and the loop counter m is incremented by 1 in the step M8. In the step M9, a judgement is made upon whether the repetition count n equals the loop counter m or not. If the answer in the step M9 is in the negative "NO", the control is returned to the step M6. If the answer in the step M9 is in the affirmative "YES", the main routine terminates. Therefore, the deposition process and the oxygen introduction process are repeated, until the loop counter m becomes equal to the repetition count n.

Preferably the thus formed superconductive thin film may be used as parts of a high frequency passive element in combination with a small-sized refrigerator having a volume, for example, approximately of 500 cc. In general, this kind of the refrigerator provides a cooling temperature approximately of 70K. The superconductive thin film in the YBCO system has a high frequency surface resistance (hereinlater referred to simply as "Rs") which is substantially constant at one temperature range considerably lower than its critical temperature. The Rs of the YBCO system superconductive thin film is, however, sharply turned up at another temperature range close to its critical temperature. The cooling temperature of 70K is almost plotted on the boundary between the above two temperature ranges in the YBCO system. Consequently, the Rs of the YBCO system superconductive thin film tends to considerably rise at the temperature of 70K.

For instance of this embodiment, the Rs of each superconductive thin film having different thickness was measured by using a dielectric resonator method (under conditions of a frequency of 17 GHz and an input of electric power of 1 mW). In one experiment of the superconductive thin film having the thickness of 450 nm and the critical temperature of 87K, the Rs showed an extremely low value of 0.1 mΩ at 30K. However, the Rs rose to 0.4 mΩ at 70K which is four times larger than the Rs at 30K. Moreover, the Rs even exceeded 10 mΩ at 80K. In another experiment of the superconductive thin film having the thickness of 900 nm and the critical temperature of 88K, the Rs represented 0.1, 0.2 and 2 mΩ at 30, 70 and 80K, respectively.

The above results indicate that the Rs of the superconductive thin film having the thickness of 900 nm becomes lower than that of the superconductive thin film having the thickness of 450 nm at 70K or 80K. The reasons for these results will be explained hereinlater. The superconductive thin film in the YBCO system has a magnetic filed penetration depth at which high frequency electronic current is allowed to flow. As the temperature rises, the magnetic field penetration depth also increases. For example, one magnetic field penetration depth is 150 nm at 30K, while another magnetic field penetration depth is 450 nm at 70K. As a result, the film thickness of 450 nm is insufficient to prevent from the saturation with the electric current at 70K. On the other hand, the film thickness of 900 nm is sufficient to prevent from the saturation with the electric current at 70K.

The Rs was also measured in superconductive thin films having various thicknesses and under the conditions of the temperature of 70K and the input electric power of 1 W. Each of the superconductive thin film layers was formed through the deposition process carried out and continues for 3 hours and the oxygen introduction process also carried out and continues for 3 hours to attain the thickness of 225 nm. A pair of the deposition process and the oxygen introduction process was repeated to gradually increase the thickness of the superconductive thin film. The Rs of the formed superconductive thin films for every thickness was measured as described above. When the repetition count n was set to 12, the superconductive thin film attained the thickness of 2700 nm and the Rs of 0.15 mΩ. Even if the thickness of the superconductive thin film is larger than 2700 nm, the Rs cannot decrease smaller than 0.15 mΩ. This means that the thickness of the superconductive thin film should be limited to 2700 nm.

Thus, the embodiment of the superconductive thin film formation method has another advantage over the prior-art method in making it possible to form the superconductive thin film which has sufficient thickness to prevent from the saturation with the electric current and the preferred critical temperature.

The many features and advantages of the invention are apparent from the detailed specification, and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described herein, and accordingly, all suitable modifications and equivalents may be construed as being encompassed within the scope of the invention.

What is claimed is:

1. A superconductive thin film formation method of forming an oxide superconductive thin film having a critical temperature equal to or higher than 87K and a predetermined thickness of 500 nm or larger, said method comprising the steps of:

(a) depositing an oxide superconductive thin film layer on a substrate at a substrate temperature of 650° C. or higher and under an oxygen partial pressure of 1 Torr or lower in a chamber for a first predetermined time, said superconductive thin film having a thickness smaller than 500 nm;

(b) introducing oxygen at a substrate temperature of 500° C. or lower and under an oxygen partial pressure of 10 Torr or higher in said chamber for a second predetermined time;

(c) depositing an oxide superconductive thin film layer at a substrate temperature of 650° C. or higher and under an oxygen partial pressure of 1 Torr or lower in said chamber for a third predetermined time, said superconductive thin film layer having a thickness smaller than 500 nm;

(d) introducing oxygen at a substrate temperature of 500° C. or lower and under an oxygen partial pressure of 10 Torr or higher in said chamber for a fourth predetermined time; and (e) repeating the steps (c) and (d) until the sum of said thickness of said superconductive thin film layers is substantially equal to said predetermined thickness of said superconductive thin film.

2. A superconductive thin film formation method as set forth in claim 1, in which said superconductive thin film has a thickness of 2700 nm or smaller and a surface resistance smaller than 0.4 mΩ at 70K measured at a frequency of 17 GHz.

3. The superconductive thin film formation method as set forth in claim 1, in which said first predetermined time is determined based on a deposition ratio of the thickness of said superconductive thin film layer deposited in the step (a) to the thickness of said superconductive thin film, said third predetermined time is determined based on a deposition ratio of the thickness of each of said superconductive thin film layers deposited in the step (c) to the thickness of said superconductive thin film, and said second and fourth predetermined times are determined to be equal to or longer than said first and third predetermined times, respectively.

* * * * *